United States Patent [19]

Okuno et al.

[11] Patent Number: 5,534,355
[45] Date of Patent: Jul. 9, 1996

[54] ARTIFICIAL MULTILAYER AND METHOD OF MANUFACTURING THE SAME

[75] Inventors: Shiho Okuno, Kawasaki; Susumu Hashimoto, Ebina; Keiichiro Yusu, Kawasaki; Koichiro Inomata, Yokohama, all of Japan

[73] Assignee: Kabushiki Kaisha Toshiba, Kawasaki, Japan

[21] Appl. No.: 424,082

[22] Filed: Apr. 19, 1995

Related U.S. Application Data

[63] Continuation of Ser. No. 120,236, Sep. 14, 1993, abandoned, which is a continuation of Ser. No. 786,727, Nov. 1, 1991, abandoned.

[30] Foreign Application Priority Data

Nov. 1, 1990 [JP] Japan ................................. 2-293566
Mar. 27, 1991 [JP] Japan ................................. 3-063527

[51] Int. Cl.⁶ .......................... G11B 5/66; B32B 15/01
[52] U.S. Cl. ...................... 428/611; 428/212; 428/336; 428/635; 428/662; 428/667; 428/668; 428/672; 428/674; 428/680; 428/681; 428/693; 428/900; 428/928; 428/692; 360/113; 360/126; 324/252; 427/131; 427/547; 427/598
[58] Field of Search ................................. 428/611, 635, 428/662, 667, 668, 672, 674, 680, 681, 692, 693, 694, 900, 928, 336, 212; 360/126, 113; 324/252; 427/131, 547, 598

[56] References Cited

U.S. PATENT DOCUMENTS

| | | | |
|---|---|---|---|
| 3,350,180 | 10/1967 | Croll | 428/611 |
| 3,375,091 | 3/1968 | Feldkeller | 428/611 |
| 3,516,076 | 6/1970 | Stein | 428/611 |
| 4,576,876 | 3/1986 | Shiiki et al. | 428/679 |
| 4,587,176 | 5/1986 | Carcia | 428/611 |
| 4,677,032 | 6/1987 | Robinson | 428/611 |
| 4,686,472 | 8/1987 | Van Ooijeu et al. | 324/252 |
| 4,687,712 | 8/1987 | Sugita | 428/611 |
| 4,847,161 | 7/1989 | Rupp | 428/450 |
| 4,935,311 | 6/1990 | Nakatani et al. | 428/611 |
| 4,949,039 | 8/1990 | Grünberg | 324/252 |
| 5,051,288 | 9/1991 | Ahlert et al. | 428/64 |
| 5,132,859 | 7/1992 | Andricacos et al. | 360/113 |
| 5,134,533 | 7/1992 | Friedrich et al. | 360/113 |
| 5,159,513 | 10/1992 | Dieny et al. | 360/113 |
| 5,206,590 | 4/1993 | Dieny et al. | 324/252 |

FOREIGN PATENT DOCUMENTS 2452168  9/1980  France .

OTHER PUBLICATIONS

Araki et al "Magnetic and Mognetoresistive Properties of Au/Co Superlatices" vol. 13 No. 2 1989.

Carbone et al "Antiparallel coupling between Fe layers separated by a Cr interlayer: Dependence of Magnetigation on film Thickness" Physical Review B vol. 36 No. 4 pp. 2433–2435.

Baibich et al "Giant Magnets resistance of (001) Fe/(001) Cr Magnetic Superlastices" Physical Review Letters 61(21) 1988.

Bruce Gurney et al "Influence of Au and Ag at the interface of sputtered giant magnetoresistance Fe/Cr multilayers" IEEE Transactions on Magnetics 26 (1990) Sep. No. 5 pp. 2747–2749.

(List continued on next page.)

Primary Examiner—Stevan A. Resan
Attorney, Agent, or Firm—Oblon, Spivak, McClelland, Maier & Neustadt

[57] ABSTRACT

Disclosed is an artificial multilayer in which ferromagnetic layers and nonmagnetic layers are alternatively laminated, wherein a uniaxial magnetic anisotropy is introduced into the ferromagnetic layers in a predetermined direction, thereby controlling the gradient of the relative change of resistivity to the change of external magnetic field. The uniaxial magnetic anisotropy is introduced into the ferromagnetic layers by applying a magnetic field along the surface of ferromagnetic layers during the formation thereof.

52 Claims, 9 Drawing Sheets

OTHER PUBLICATIONS

Parkin et al "Ocillations in Exchange Coupling and Magnetoresistance in Metallic Superlattice Structures Co/Ru, Co/Cr and Fe/Cr" Physical Rev. Letters vol. 64 No. 19 7 May 1990.

Krebs et al "Magnetic Resonance Determination of the Antiferromagnetic Coupling of Fe layers through Cr" Phys Nev. Letters 63(15) Oct. 1989.

Cormley et al "Theory of Giant Magnets Resistance Effects in Magnetic Layered Structure with Antiferromagnetic Coupling" Phys Rev. Letters 63(6) Aug. 1989.[00f4]

Binasch, G. et al, "Enhanced Magnetoresistance in Layered Magnetic Structures With Antiferromagnetic Interlayer Exchange", *Physical Review B*, vol. 39, No. 7, 1 Mar. 1989, pp. 4828–4830.

Chemical Abstracts, vol. 63, No. 2, 1965 Columbus OH, US. L. V. Kirenskii. col. 1318 "Multilayer Ferromagnetic Films".

Patent Abstracts of Japan vol. 7 No. 170 (E–189) (1315) Jul. 27, 1983. Oct. 05, 1983 Hideo Fujiwara "Multi–Layer Magnetic Thin Film And Manufacture Thereof".

Digest of Intermag 90 Apr. 1990, Brighton GB p. 10 F. Suits "Bilayer Permalloy Films With Orthogonal Easy–Axes".

Patent Abstracts of Japan vol. 11, No. 300(C–449) (2747) Sep. 29, 1987 Matahiro Komuro "Multilayered Fe–Cu Film".

Journal of the Physical Society of Japan. vol. 53, No. 8 Aug. 8, 1984 pp. 2659–2667 N. Hosoiito, et al. "Magnetic Properties Of Fe–V Multilayered Films With Artificial Superstructures".

ARTIFICIAL MULTILAYER AND METHOD OF MANUFACTURING THE SAME

This application is a Continuation of application Ser. No. 08/120,236, filed on Sep. 14, 1993, now abandoned, which is a Continuation of application Ser. No. 07/786,727, filed on Nov. 1, 1991, abandoned.

BACKGROUND OF THE INVENTION

1. Field of the Invention

The present invention relates to an artificial multilayer having a magnetoresistance effect and a method of manufacturing the same.

2. Description of the Related Art

An electrical resistivity p of a substance, which has a specific value at a predetermined temperature, varies with application of an external magnetic field. This phenomenon is called "a magnetoresistance effect", which is one of galvanomagnetic effects in the same manner as a Hall effect.

This magnetoresistance effect is applied to magnetoresistive elements such as a magnetoresistive field sensor, or a magnetoresistive head (MR head). As a material exhibiting the magnetoresistance effect, a semiconductor and a ferromagnetic material are known.

Since the physical properties of the semiconductor generally vary largely depending on temperature, the upper limit of its operating temperature is restricted to about 100° C. On the contrary, the ferromagnetic material has a small temperature coefficient, and the upper limit of its operating temperature is a Curie point in principle, so that the ferromagnetic material can be used up to much higher temperature as compared with the semiconductor. Further, since the ferromagnetic material can easily be formed in a thin film and miniaturized, a magnetoresistive element made of the ferromagnetic material can effectively detect a magnetic field even if a distance between magnetic charges is as short as µm order.

The magnetoresistance effect of the ferromagnetic material observed when an external magnetic field is relatively weak has a feature that its resistivity varies according to an angle formed between a magnetizing direction and a current direction. This phenomenon is particularly called an anisotropic magnetoresistance effect. The resistivity of general ferromagnetic metal takes maximum when its magnetizing direction is parallel to a current direction ($\rho//$) and minimum when both are crossed perpendicularly to each other ($\rho\perp$). As a quantity of representing the magnitude of the anisotropic magnetoresistance effect, a ratio $\Delta\rho/\rho_0$ is used, where $\Delta\rho=\rho//-\rho\perp$, and $\rho_0$ is the resistivity when an applied magnetic field is zero. As materials having large $\Delta\rho/\rho_0$ at a room temperature, Ni-Co or Ni-Fe based alloys are known. Noted that their $\Delta\rho/\rho_0$ are no more than about 2.5 to 6.5%.

It has been recently reported that a large magnetoresistance effect is observed in an artificial multilayer in which ferromagnetic layers and nonmagnetic layers are alternatively laminated and magnetization of adjacent ferromagnetic layers are arranged in antiparallel (Phys. Rev. Lett. Vol. 61. p. 2472 (1988)). For example, a multilayer consisting of Fe (a ferromagnetic layer)/Cr (a nonmagnetic layer) system is known. The Fe/Cr multilayer formed on a glass substrate, the maximum relative change of resistivity $(\rho_s-\rho_0)/\rho_0$, where $\rho_0$ is the resistivity when an applied magnetic field is zero and $\rho_s$ is the resistivity when the magnetization is saturated, has very large values of −8.4% at a room temperature and −26.4% at 77 K (J. App. Mag. Soc. vol. 14, p. 351 (1990)). In such a type of artificial multilayer, however, a saturated magnetic field, i.e. an external magnetic field required to saturate the relative change of resistivity, is 10 kOe or more at a room temperature which much exceeds a practical range required for a magnetoresistive field sensor or an MR head.

Further, it is reported that artificial multilayers other than Fe/Cr system, for example Ni-Fe/Cu/Co/Cu system (J. Phys. Soc. Jap. 59 (1990) 3016) or Ni-Fe/Cu/Ni-Fe/FeMn system (35th Annual Conference on Magnetism and Magnetic Materials, 1990), also exhibit a large magnetoresistance effect.

In these artificial multilayers, an antiparallel aligned state of magnetization which leads to the large magnetoresistance effect, is realized on the way of magnetizing process due to a difference of anisotropies of two types of ferromagnetic layers, that is, a hard layer (a layer having a large magnetic anisotropy) such as Co or FeMn/Ni-Fe, and a soft layer (a layer having a small magnetic anisotropy) such as Ni-Fe (permalloy). The Ni-Fe/Cu/Co/Cu system, however, exhibits a large hysteresis in the magnetoresistance effect with respect to the magnetic field. Therefore, it is required to reduce the hysteresis as small as possible. On the other hand, the Ni-Fe/Cu/Ni-Fe/FeMn system exhibits a small hysteresis in a weak magnetic field up to 15 Oe. Further, its relative change of resistivity $\Delta\rho/\rho_0$ varies stepwise to the change of external magnetic field $\Delta H$, that is preferable in practical use. In view of various applications of the magnetoresistance effect, however, it is more preferable to be able to control the relative change of resistivity so as to vary at an arbitrary gradient to the change of external magnetic field, rather than stepwise variation.

SUMMARY OF THE INVENTION

Accordingly, it is an object of the present invention to provide an artificial multilayer of which relative change of resistivity $\Delta\rho/\rho_0$ can be controlled so as to vary at an arbitrary gradient to the change of magnetic field $\Delta H$.

An artificial multilayer according to the present invention comprises ferromagnetic layers and nonmagnetic layers which are alternatively laminated, wherein a uniaxial magnetic anisotropy is introduced into the ferromagnetic layers in a predetermined direction along the surface of the multilayer.

A method of manufacturing the artificial multilayer according to the present invention comprises a step of introducing a uniaxial magnetic anisotropy into the ferromagnetic layers in a predetermined direction by applying a magnetic field along the surface of the ferromagnetic layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

In the present invention, a ferromagnetic layer consists of at least one material selected from a group of transition metals such as Fe, Co, Ni, and their alloys and compounds. The word "nonmagnetic" in this application includes paramagnetic and antiferromagnetic. A nonmagnetic layer consists of at least one selected from a group of transition metals such as V, Cr, Cu, Au, etc., and their alloys and compounds. These layers may be crystalline or amorphous. The thickness of the ferromagnetic layer is preferably 0.5 to 20 nm, the thickness of the nonmagnetic layer is preferably 0.5 to 20 nm, and the thickness of the entire laminated layers is preferably 30 to 500 nm.

In the present invention, the artificial multilayer includes a multilayer in which different types of layers are coherently laminated or different types of layers, though not coherently, but are laminated under the control of the thickness in an accuracy of several angstrom to 10 nm.

In the present invention, a uniaxial magnetic anisotropy is introduced to the ferromagnetic layers which constitute the artificial multilayer in a predetermined direction along the surface of the multilayer. For example, the uniaxial magnetic anisotropy can be introduced by applying a magnetic field of 20 to 500 Oe along the surface of the multilayer at the time of formation of multilayer by sputtering, etc. The uniaxial magnetic anisotropy can also be introduced by heat treating the multilayer in the magnetic field after the multilayer is formed.

The artificial multilayer of the present invention may be formed on an arbitrary substrate, that is, a non-singlecrystalline substrate made of such as glass, or a singlecrystalline substrate made of such as Si.

The uniaxial magnetic anisotropy can also be introduced in the ferromagnetic layers by forming an epitaxial-growth-multilayer which has single crystal structure in each layer. By selecting a suitable single crystal substrate, crystal orientation of single crystal ferromagnetic layers can be controlled, and as a result, it is possible to change the direction of crystalline magnetic anisotropy which originates from crystalline symmetry.

In the artificial multilayer according to the present invention, the electrical resistivity of the ferromagnetic layers is maximum when magnetizations of adjacent two ferromagnetic layers are aligned antiparallel to each other and minimum when aligned in parallel with each other. In the case of Fe/Cr multi-layer, the antiparallel aligned state of magnetizations of the ferromagnetic layers is obtained by an antiparallel coupling of the ferromagnetic layers to one another through the antiferromagnetic layer (Cr). In the artificial multilayer comprising two different ferromagnetic layers and utilizing a difference between magnetic anisotropies of two types of ferromagnetic layers, i.e. a hard layer and a soft layer, the antiparallel aligned state of magnetizations of the ferromagnetic layers occurs due to a magnetizing process. The antiparallel aligned state is converted to a parallel aligned state by an external magnetic field. As a result, the resistivity of the ferromagnetic layers is varied.

In the artificial multilayer formed on a non-singlecrystalline substrate such as a glass substrate in a nonmagnetic field as in prior art, the ferromagnetic layers have an easy axis of magnetization along their surfaces due to a demagnetizing field, but its direction is isotropic in the plane, so that the easy axis exists in various directions.

On the contrary, when a uniaxial magnetic anisotropy is introduced to an artificial magnetic multilayer utilizing an antiferromagnetic coupling between the ferromagnetic layers such as exists in the Fe/Cr system, the easy axis 10 of magnetization of the ferromagnetic layers all orient to one direction along the surface of the layers. Therefore, when the resistivity of such an artificial multilayer is measured with applying an external magnetic field in that direction, a saturated magnetic field is reduced as compared with those which is formed in nonmagnetic field and of which easy axis is isotropic in the plane. When its resistivity is measured with the uniaxial magnetic anisotropy being directed at a certain angle θ with respect to the direction of the external magnetic field, the gradient of the relative change of resistivity $\Delta\rho/\rho_0$ to the change of magnetic field $\Delta H$, i.e. $(\Delta\rho/\rho_0)\Delta H$, will be gentle, although the saturated magnetic field is increased. Such a gentle gradient is convenient to detect the magnitude of the external magnetic field.

In the case of the artificial multilayer utilizing both of a soft layer and a hard layer, there are two combinations due to ways of introducing a uniaxial magnetic anisotropy to both layers.

In one method, uniaxial magnetic anisotropies are introduced in the same directions to both of the soft and hard layers. In this case, similarly to the above, when its resistivity is measured with applying an external magnetic field in the direction of the uniaxial magnetic anisotropy, a saturated magnetic field is reduced, and its hysteresis can be reduced. When its resistivity is measured with the uniaxial magnetic anisotropy being directed at a certain angle θ with respect to the direction of the external magnetic field, the gradient $(\Delta\rho/\rho_0)/\Delta H$ will be gentle, resulting to be convenient to detect the magnitude of the external magnetic field.

In the other method, uniaxial magnetic anisotropies are introduced in the different directions to the soft and hard layers. It is preferable to set an angle formed between the directions of uniaxial magnetic anisotropies to be introduced into the both layers to 30°<θ<90°. In this case, when its resistivity is measured with the uniaxial magnetic anisotropy of the soft layer, in particular, being directed at a certain angle θ with respect to the direction of the external magnetic field, the gradient $(\Delta\rho/\rho_0)/\Delta H$ can be controlled. When it is measured by setting θ=0°, a stepwise change of magnetoresistance can be obtained.

In any of the above-described cases, the gradient $(\Delta\rho/\rho_0)/\Delta H$ will become most abrupt when the angle θ=0° formed between the direction of the introduced uniaxial magnetic anisotropy and the direction of the external magnetic field, and most gentle when the angle θ=90°. In order to obtain a gradient convenient to detect the magnitude of the external magnetic field, it is preferable to set to 30°<θ<90°.

EXAMPLES

Examples of the present invention will be described.

[EXAMPLE 1]

Figure 1A:
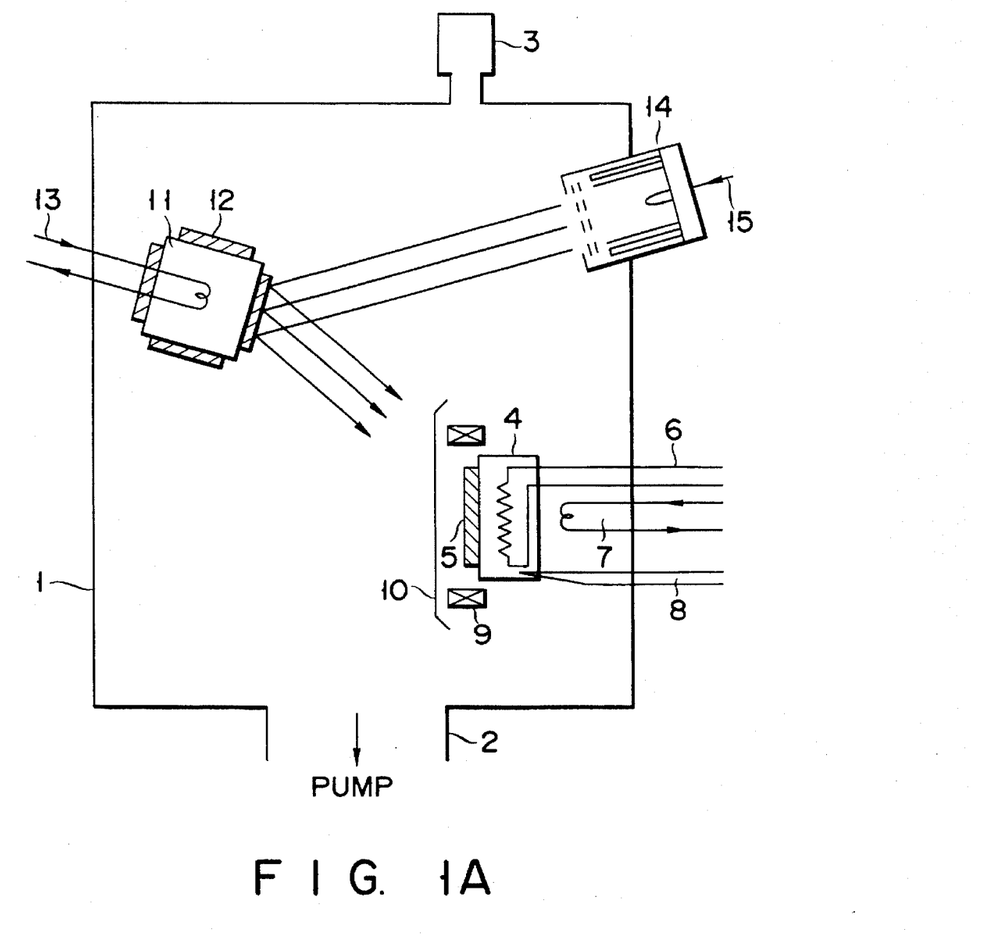
FIG. 1A is a view showing the construction of an ion beam sputtering apparatus used in an embodiment of the present invention.

FIG. 1A shows an ion beam sputtering apparatus used in this example. An exhaust port 2 of a chamber 1 is connected to a vacuum pump (not shown), and the pressure in the chamber 1 is measured by a pressure gauge 3. A substrate holder 4 is installed in the chamber 1, and a substrate 5 is held on the substrate holder 4. A heater 6 is provided in the substrate holder 4, and cooling water 7 is flowed near the substrate holder 4 to regulate the temperatures of the substrate holder 4 and the substrate 5. The temperature of the substrate holder 4 is measured with a thermocouple 8. Means for applying magnetic field 9 is provided near the substrate 5 to apply a magnetic field along the surface of a layer to be formed on the substrate 5. A shutter 10 is provided in front of the substrate 5. A target holder 11 is rotatably provided at a position opposed to the substrate 5, and a plurality of targets 12 are mounted on the surface of target holder 11. The target holder 11 is cooled by cooling water 13. An ion gun 14 is provided at a position opposed to the targets 12, and Ar gas 15 is supplied to the ion gun 14.

Figure 1B:
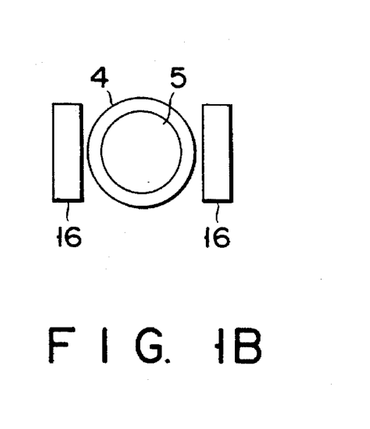
FIGS. 1B and 1C are plan views showing dispositions of means for applying magnetic field at the periphery of a substrate.
Figure 1C:
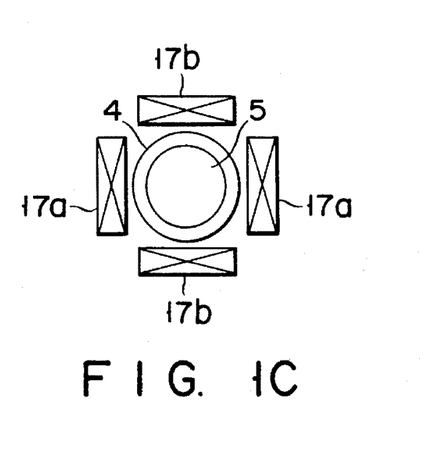

As the means for applying magnetic field 9, as shown in FIG. 1B, a pair of permanent magnets 16 may be provided, or, as shown in FIG. 1C, two pairs of Helmholtz coils 17a and 17b may be provided. In the case of FIG. 1C, the direction of the magnetic field can be altered in directions perpendicular to each other according to which of the two pairs of Helmholtz coils 17a and 17b are used.

Figure 2:
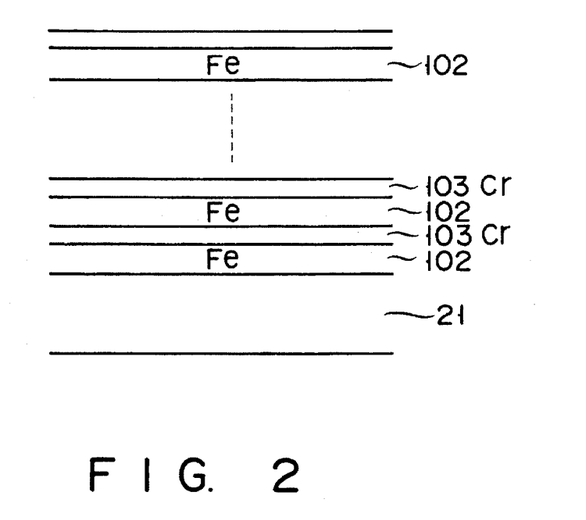
FIG. 2 is a sectional view showing the arrangement of an artificial multilayer of Example 1.

An artificial multilayer having layers of Fe/Cr was manufactured by using an ion beam sputtering apparatus shown in FIG. 1A. As the substrate 5, quartz glass was employed. Two types of targets 12 made of Fe and Cr were mounted on the target holder 11. The chamber 1 was exhausted up to $2\times10^{-7}$ Torr, and then Ar gas was introduced into the ion gun 14 to set the pressure to $3\times10^{-4}$ Torr. Ar was ionized and accelerated, and then emitted to the target 12 with the energy of 500 eV. The temperature of the substrate was varied from a room temperature to 400° C. Two types of targets were rotated at each predetermined time to alternatively laminate Fe layer 102 and Cr layer 103 on the quartz glass substrate 21, as shown in FIG. 2, thereby manufacturing an artificial multilayer. During this process, a magnetic field of 100 Oe was applied to the layers by a pair of permanent magnets 16 shown in FIG. 1B to introduce a uniaxial magnetic anisotropy in a predetermined direction in the surface of the layers (Example 1).

In comparison, an artificial multilayer was manufactured similarly to the above process except that the layers are formed in a nonmagnetic field without using permanent magnets (Comparative example 1).

The artificial multilayers obtained as described above are expressed by $(t_{Fe}/t_{Cr})_n$, where $t_{Fe}$ (nm) is the thickness of the Fe layer, $t_{Cr}$ (nm) is the thickness of the Cr layer, and n is the number of repetition of a pair of the Fe layer and the Cr layer. In this example, the artificial multilayer of $(t_{Fe}/t_{Cr})_n = (2.7/1.3)_7$ was manufactured.

Figure 3A:
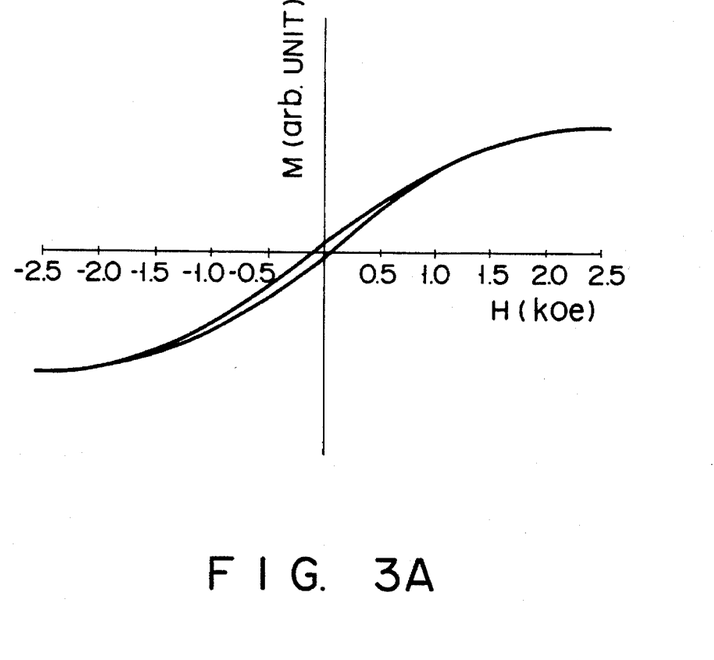
FIG. 3A shows the magnetization curve of the artificial multilayer of Comparative Example 1.
Figure 3B:
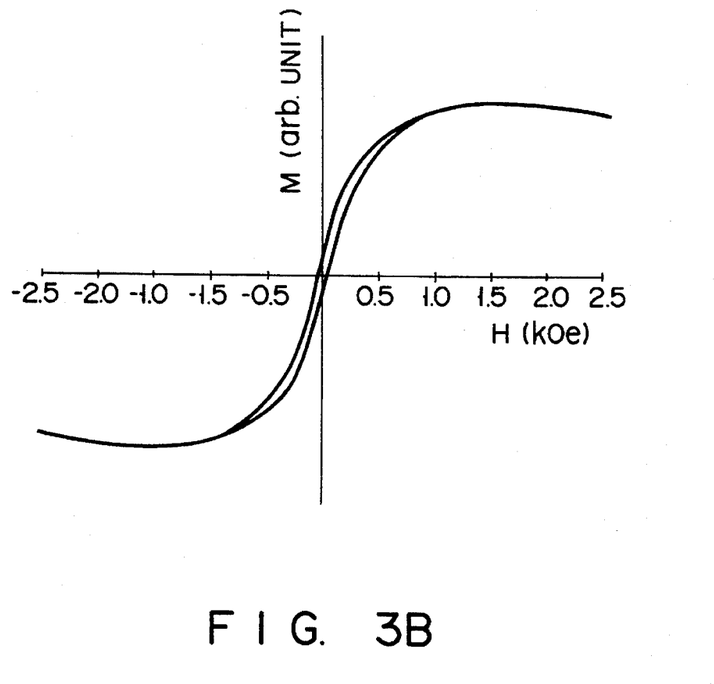
FIG. 3B shows a magnetization curve of the artificial multilayer of the Example 1.

FIGS. 3A and 3B respectively show magnetization curves of the artificial multilayers of the comparative example 1 and the example 1. From FIGS. 3A and 3B, it is understood that the saturated magnetic field is 2.5 kOe or more in the artificial multilayer of Comparative Example 1 manufactured in the nonmagnetic field, whereas it is 1.6 kOe in the artificial multilayer of Example 1 manufactured in the magnetic field. Thus, since the uniaxial magnetic anisotropy is introduced in one direction in the surface of the multilayer of Example 1, its saturated magnetic field is reduced.

Figure 4A:
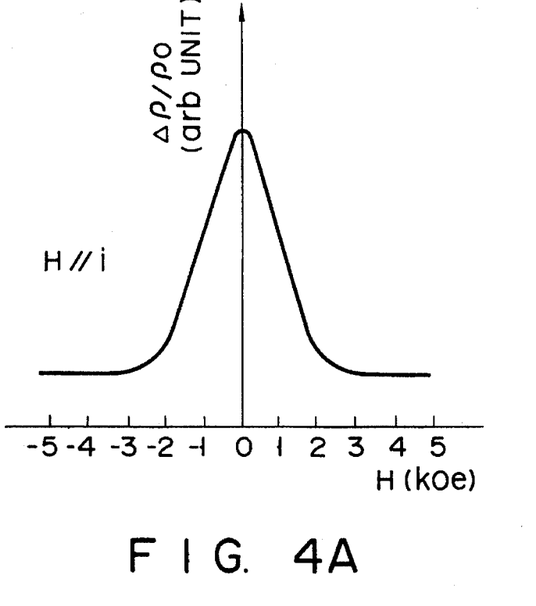
FIG. 4A shows the magnetoresistance effect of the artificial multilayer of Comparative Example 1.
Figure 4B:
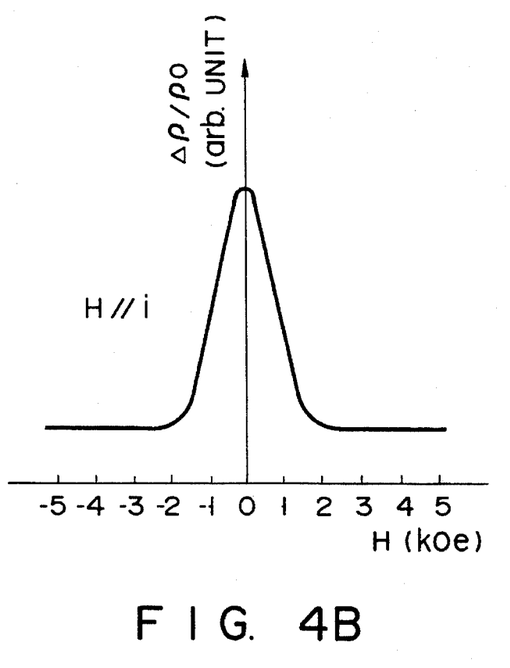
FIG. 4B shows the magnetoresistance effect of the artificial multilayer of the Example 1.

FIGS. 4A and 4B respectively show the magnetoresistance effects of the artificial multilayers of Comparative Example 1 and Example 1. At the time of measurements, the direction of a current was set parallel to that of the external magnetic field. The artificial multilayer of Example 1 formed in a magnetic field was measured in such a manner that the direction of the uniaxial magnetic anisotropy was set to that of the external magnetic field. As understood from FIGS. 4A and 4B, the external magnetic field for saturating the relative change of resistivity is about 3 kOe in the artificial multilayer of Comparative Example 1, and 2 kOe or less in the artificial multilayer of Example 1. Similarly to the results of FIGS. 3A and 3B, since the uniaxial magnetic anisotropy is introduced into one direction in the surface of the multilayer in Example 1, its saturated magnetic field is reduced.

Even when measurements were executed by crossing the direction of the current perpendicularly to that of the magnetic field, similar results to those of FIGS. 4A and 4B were obtained.

[EXAMPLE 2]

Similarly to the example 1, amorphous alloys shown in Table 1 having a thickness of 3 nm as ferromagnetic layers and Cu having a thickness of 1 nm as nonmagnetic layers were alternatively laminated on a quartz glass substrate, and an artificial multilayer having an entire thickness of 50 nm was manufactured.

The results of the resistivity and relative change of resistivity of the artificial multilayers measured by a four-point method at a room temperature are shown in Table 1.

As shown in Table 1, for example, the resistivity of the artificial multilayer utilizing the amorphous alloy of Sample No. 5 is 130 μΩ-cm. This value is slightly larger than that of the amorphous alloy only. Its relative change of resistivity was saturated in the low magnetic field (several hundreds Oe), and the relative change of this case was about −10%. This relative change is calculated in terms of variation in the resistivity of 13 μΩ-cm. Therefore, when the multilayer is applied as a magnetoresistive element, a large output is obtained upon the change of the resistivity. This is advantageous in practical use of the magnetoresistive element.

TABLE 1

| Sample Nos. | Composition of alloys (at %) | Resistivity (μΩ-cm) | Relative change of resistivity |
|---|---|---|---|
| 1 | $Fe_{75}Si_{12.5}B_{12.5}$ | 162 | −8.5 |
| 2 | $Fe_{73}B_{27}$ | 158 | −7.2 |
| 3 | $(Co_{0.94}Fe_{0.06})_{70}B_{30}$ | 164 | −7.0 |
| 4 | $Co_{85}Zr_{15}$ | 147 | −9.3 |
| 5 | $Co_{80}Zr_{10}Nb_{10}$ | 130 | −9.8 |

[EXAMPLE 3]

Similarly to the example 1, the amorphous alloy of Sample No. 4 in Table 1 having a thickness of 3 nm as ferromagnetic layers and Cr having a thickness of 1 nm as nonmagnetic layers instead of the Cu of Example 2 were alternatively laminated on a quartz glass substrate, and an artificial multilayer having an entire thickness of 50 nm was manufactured.

From the measurements of the artificial multilayer by a four-point method at a room temperature, its resistivity was 160 μΩ-cm, and the relative change of resistivity was −7% at the saturated magnetic field of 300 Oe.

[EXAMPLE 4]

Similarly to the example 1, Fe-based alloys shown in Table 2 having a thickness of 2 nm as ferromagnetic layers and Cr having a thickness of 1.2 nm as nonmagnetic layers were alternatively laminated on a quartz glass substrate, and an artificial multilayer having an entire thickness of 64 nm was manufactured.

The values of saturated magnetic field of the artificial multilayers were measured when an external magnetic field was applied in the direction of easy axis (θ=0°) and the direction of difficult axis (θ=90°). In comparison, the saturated magnetic field of the artificial multilayers formed in nonmagnetic field were also measured. These measurement results are shown in Table 2.

As understood from Table 2, when the external magnetic field is applied in the direction of the easy axis (in the direction of uniaxial magnetic anisotropy) of the artificial multilayer according to the present invention, the saturated magnetic field can be reduced as compared with the artificial multilayer formed in nonmagnetic field and in which uniaxial magnetic anisotropy is not introduced. When the external magnetic field is applied in the direction of difficult axis (in a direction perpendicular to the uniaxial magnetic anisotropy) of the artificial multilayer according to the present invention, the saturated magnetic field is increased. From these results, it is understood that the magnitude of the saturated magnetic field can be controlled by varying θ between 0° and 90°.

TABLE 2

| | | Saturated magnetic field (KOe) | | |
|---|---|---|---|---|
| | | Multilayer formed in magnetic field | | Multilayer formed |
| Sample Nos. | Composition of alloys (at %) | easy axis | difficult axis | in nonmagnetic field |
| 11 | $Fe_{95}Co_5$ | 3.3 | 4.2 | 3.5 |
| 12 | $Fe_{90}Co_{10}$ | 3.1 | 4.6 | 3.8 |
| 13 | $Fe_{80}Co_{20}$ | 1.6 | 2.9 | 2.2 |
| 14 | $Fe_{75}Co_{25}$ | 0.9 | 2.1 | 1.5 |

[EXAMPLE 5]

An Fe/Cr artificial multilayer of $(t_{Fe}/t_{Cr})_n=(2.5/1.3)_{30}$ was manufactured on a quartz glass substrate (at room temperature) by the similar method to that of Example 1 except that the magnetic field is not applied. The saturated magnetic field of the artificial multilayer was 2.7 kOe.

Then, the artificial multilayer was heat treated at 50° C. in vacuum in a magnetic field. With regard to the obtained artificial multilayer, the saturated magnetic field was reduced to 2.2 kOe when the external magnetic field was applied in the direction of easy axis, while was increased to 3.2 kOe when the external magnetic field was applied in the direction of difficult axis.

[EXAMPLE 6]

Figure 5:
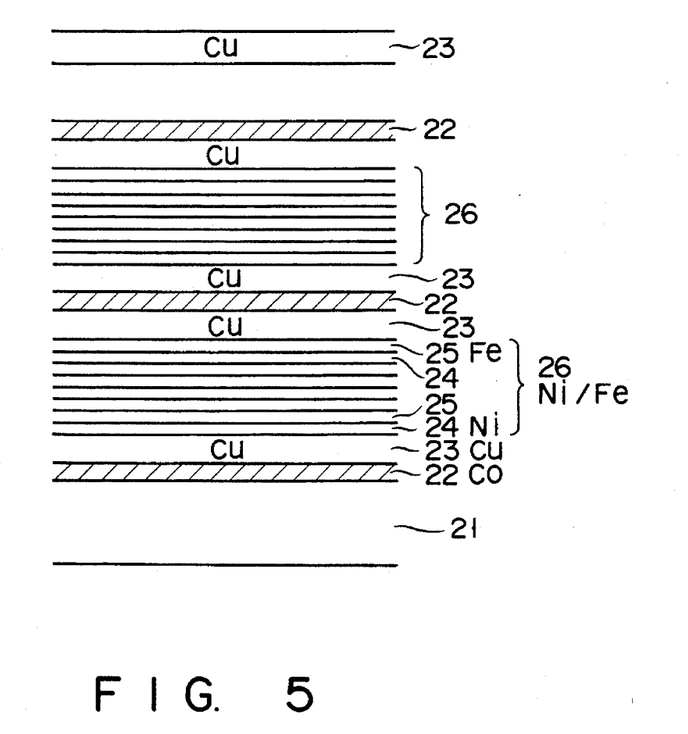
FIG. 5 is a sectional view showing the arrangement of an artificial multilayer of Example 6.

An artificial multilayer shown in FIG. 5 was manufactured by using an ion beam sputtering apparatus of FIG. 1A. As a substrate, quartz glass was used, and as targets, Co, Cu, Ni and Fe were used. A pair of permanent magnets 16 were disposed oppositely near a substrate holder as shown in FIG. 1B, and a multilayer was formed in a magnetic field of 100 Oe.

This artificial multilayer has a structure in which N layers of laminated layers each having a Co layer 22 having a thickness of 2.5 nm, a Cu layer 23 having a thickness of 5 nm, an $(Ni/Fe)_n$ layer 26 in which Ni layers 24 having a thickness of 2 nm and Fe layers 25 having a thickness of 2 nm are alternately laminated, and a Cu layer 23 having a thickness of 5 nm to be sequentially laminated, are repeatedly formed.

The artificial multilayer is represented by $[(Ni/Fe)n/Cu/Co/Cu]_N$. In this artificial multilayer, the $(Ni/Fe)_n$ layer is a soft layer, the Cu layer is a nonmagnetic layer, and the Co layer is a hard layer.

Figure 6:
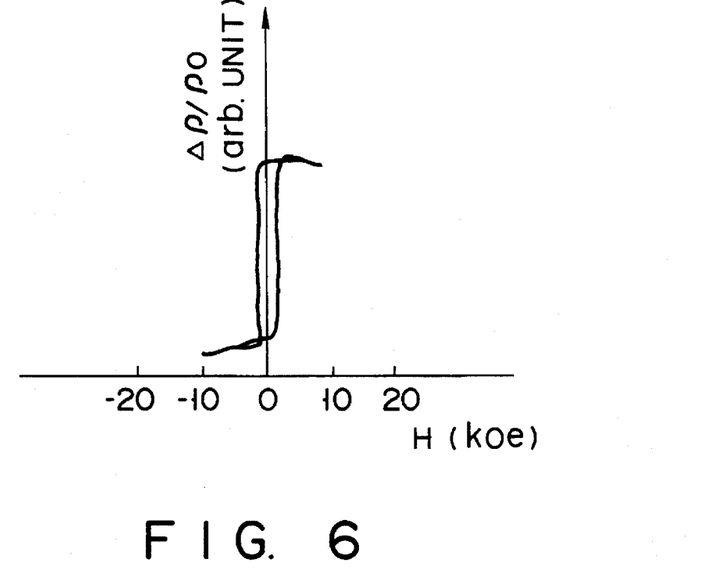
FIG. 6 is a sectional view showing the magnetoresistance effect of the artificial multilayer of Example 6.

The result in which the magnetoresistance effect of the artificial multilayer is measured in a minor loop of ±10 Oe in which the direction of the uniaxial magnetic anisotropy is parallel to that of the external magnetic field is shown in FIG. 6. It is understood from FIG. 6 that a slight hysteresis is observed, but the relative change of resistivity is varied stepwise to the magnetic field.

EXAMPLE 7]

Figure 7:
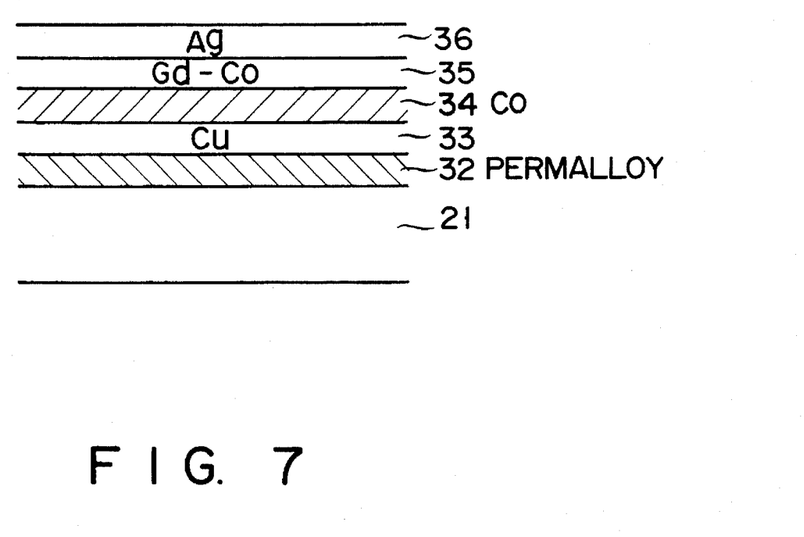
FIG. 7 is a sectional view showing the arrangement of an artificial multilayer of Example 7.

An artificial multilayer shown in FIG. 7 was manufactured by using an ion beam sputtering apparatus of FIG. 1A. As a substrate, quartz glass was used, and as targets, permalloy ($Ni_{80}Fe_{20}$), Cu, Co, Gd-Co compound, and Ag were used. A substrate temperature was set to 150° to 400° C. during the layer formation. Two pairs of Helmholtz coils 17a, 17b shown in FIG. 1C were disposed near a substrate holder, and the multilayer was formed in a magnetic field of 100 Oe.

This artificial multilayer has a structure in which a permalloy ($Ni_{80}Fe_{20}$) layer 32, a Cu layer 33, a Co layer 24, a Gd-Co layer 35 and an Ag layer 36 are sequentially laminated on a quartz glass substrate 21.

This artificial multilayer is represented as permalloy/Cu/(Co/Gd-Co)/Ag. In the artificial multilayer, the permalloy layer is a soft layer, the Cu layer is a nonmagnetic layer, the Co layer is a hard layer, the Gd-Co layer has an effect for imparting exchange anisotropy to the Co layer, and the Ag layer is a protective layer.

Figure 8A:
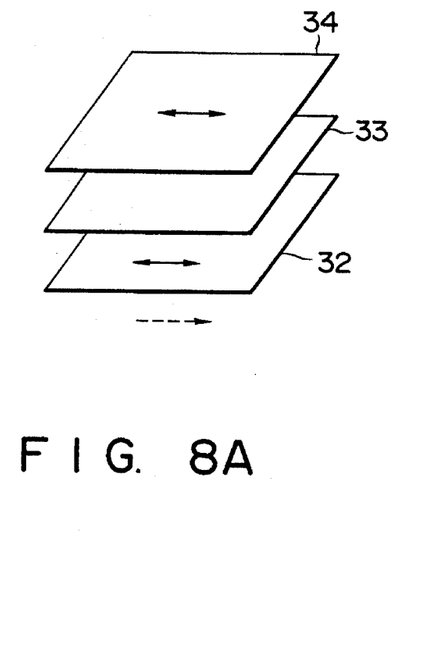
FIG. 8A is a diagram showing the case that the directions of uniaxial magnetic anisotropies introduced into a soft layer and a hard layer are parallel.
Figure 8B:
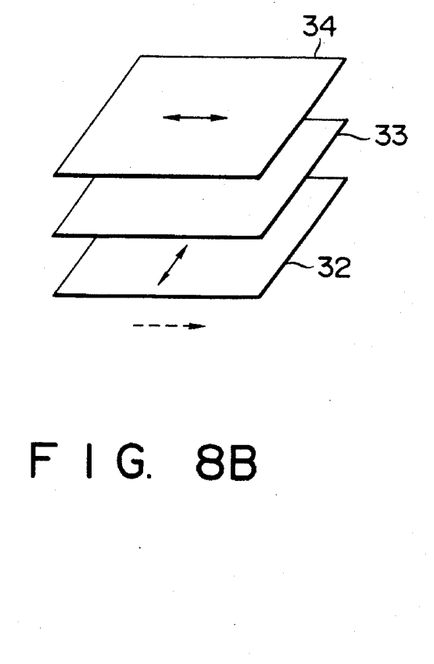
FIG. 8B is a diagram showing the case that the directions of uniaxial magnetic anisotropies introduced to the soft layer and the hard layer are crossed perpendicularly, with regard to the artificial multilayer of Example 7.

The uniaxial magnetic anisotropy was introduced in two combinations shown in FIGS. 8A and 8B by selecting the use of any of the Helmholtz coils 17a and 17b. In FIG. 8, the direction of the uniaxial magnetic anisotropy is denoted by arrows with a solid line. That is, in FIG. 8A, the direction of the uniaxial magnetic anisotropy introduced to the soft layer is parallel to that of the uniaxial magnetic anisotropy introduced to the hard layer. On the other hand, in FIG. 8B, the direction of the uniaxial magnetic anisotropy introduced to the soft layer is crossed perpendicularly to that of the uniaxial magnetic anisotropy introduced to the hard layer.

The magnetoresistance effects of the artificial multilayers obtained as described above were measured in a minor loop of ±20 Oe. At the time of the measurements, the direction of the uniaxial magnetic anisotropy introduced to the hard layer was parallel to that of the external magnetic field (denoted by an arrow with a broken line in FIG. 8). Therefore, the angle formed between the direction of the uniaxial magnetic anisotropy of the soft layer and the direction of the external magnetic field is 0° or 90°. These results are respectively shown in FIGS. 9A and 9B.

Figure 9A:
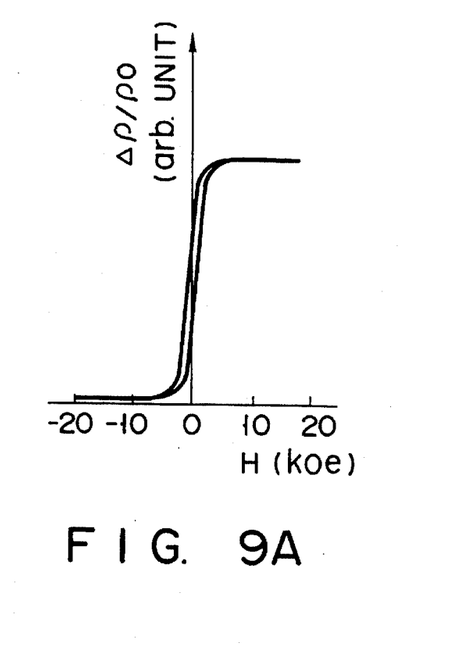
FIG. 9A shows the magnetoresistance effect of the artificial multilayer of Example 7 shown in FIG. 8A.
Figure 9B:
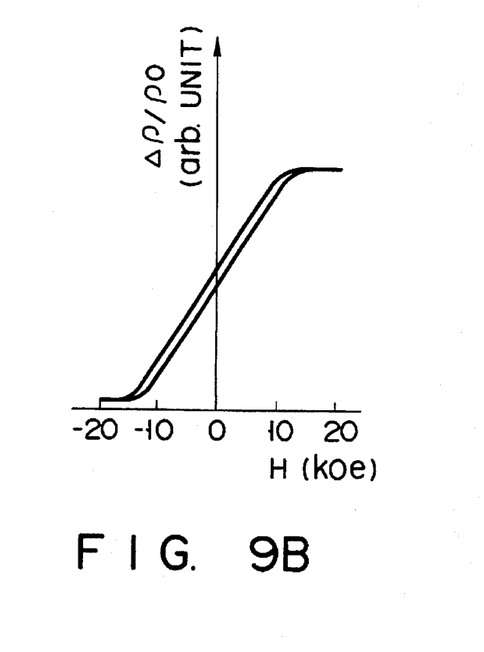
FIG. 9B shows the magnetoresistance effect of the artificial multilayer of Example 7 shown in FIG. 8B.

As apparent from FIGS. 9A and 9B, the gradient of the relative change of resistivity to the change of magnetic field, i.e. $(\Delta\rho/\rho_0)/\Delta H$, is most abrupt to exhibit a stepwise change in the case of $\theta=0°$, and most gentle in the case of $\theta=90°$. From these results, it is understood that the gradient $(\Delta\rho/\rho_0)/\Delta H$ can be controlled by setting the direction of the uniaxial magnetic anisotropy of the soft layer to an arbitrary angle $\theta$ to the direction of the external magnetic field.

[EXAMPLE 8]

Figures 10, 11:
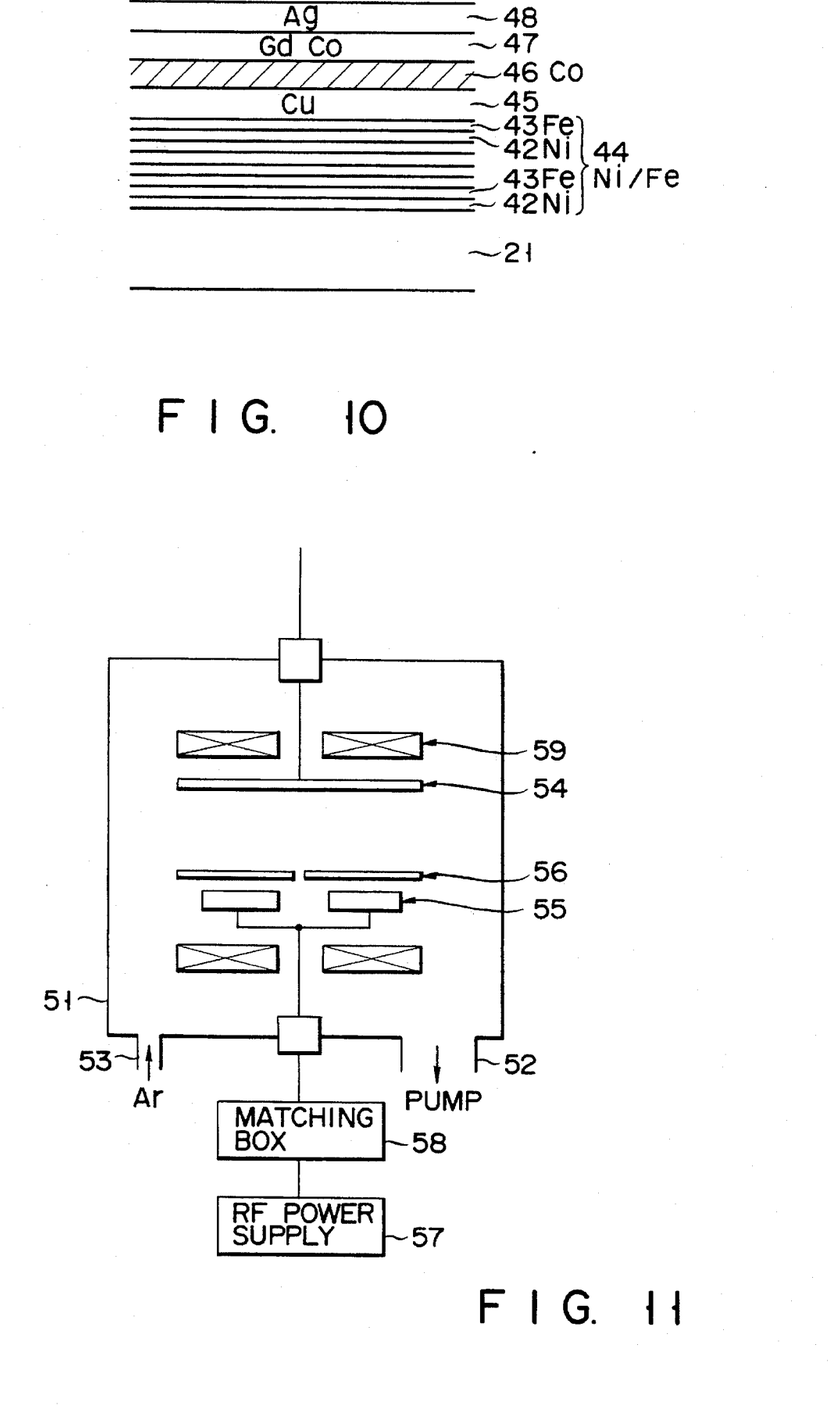
FIG. 10 is a sectional view showing the arrangement of the artificial multilayer of Example 8.
FIG. 11 is a view showing the construction of an RF magnetron sputtering apparatus used in Example 9.

An artificial multilayer shown in FIG. 10 was manufactured by using an ion beam sputtering apparatus of FIG. 1A. As a substrate, quartz glass was used, and as targets, Ni, Fe, Cu, Co, Gd-Co compound, and Ag were used. Two pairs of Helmholtz coils 17a and 17b shown in FIG. 1C were disposed near the substrate holder, and a multilayer was formed in a magnetic field of 100 Oe. This artificial multilayer has a structure in which an $(Ni/Fe)_n$ layer 44 in which Ni layers 42 and Fe layers 43 are alternatively laminated, a Cu layer 45, a Co layer 46, a Gd-Co layer 47 and an Ag layer 48 are sequentially laminated on a quartz glass substrate 21.

This artificial multilayer is expressed as $(Ni/Fe)_n$/Cu/(Co/Gd-Co)/Ag. In this artificial multilayer, the $(Ni/Fe)_n$ layer is a soft layer, the Cu layer is a nonmagnetic layer, the Co layer is a hard layer, the Gd-Co layer has an effect for imparting exchange anisotropy to the Co layer, and the Ag layer is a protective film.

Similarly to Example 7, the uniaxial magnetic anisotropy was introduced in two combinations as shown in FIGS. 8A and 8B to the soft and hard layers by selecting the use of any of the Helmholtz coils 17a and 17b, and an artificial multilayer was manufactured.

The magnetoresistance effects of the artificial multilayers were measured in a minor loop of ±20 Oe. At the time of the measurements, the direction of the external magnetic field was brought into coincidence with that of the uniaxial magnetic anisotropy introduced to the hard layer. Even in this case, the similar results to those of Example 7 (in FIGS. 9A and 9B) were obtained, and a hysteresis was slightly reduced as compared with that of Example 7.

[EXAMPLE 9]

In the examples described above, the artificial multilayers were manufactured by using the ion beam sputtering apparatus. However, the artificial multilayer may also be manufactured by using other apparatus such as an RF magnetron sputtering apparatus.

FIG. 11 shows an RF magnetron sputtering apparatus used in this example. An atmosphere in a chamber 51 is exhausted from an exhaust port 52, and Ar gas is introduced from a gas inlet 53 into the chamber 51. A substrate 54 is held at the top of the chamber 51. Targets 55 are held oppositely to the substrate 54 in the lower section of the chamber 51, and shutters 56 are provided at the targets 55 of the sides of the substrate 54. An electric field is applied from an RF power supply 57 to the targets 55 through a matching box 58. A magnetic field is applied to a space between the targets 55 and the substrate 54 by magnets 59.

An artificial multilayer having layers of Fe/Cr was manufactured by using the RF magnetron sputtering apparatus of FIG. 11. As the substrate 54, MgO was used, and as the targets 56, Fe and Cr were used. The chamber was exhausted up to $5\times10^{-6}$ Torr. The conditions of forming the layers of Fe and Cr were set to the two types of conditions shown in Table 3. The shutters 57 of the targets 56 were alternatively opened and closed to form the multilayer, and two types of artificial multilayers of Samples A and B represented by $(t_{Fe}/t_{Cr})_n=(2.7/1.3)_{10}$ were manufactured.

TABLE 3

|  |  | Sample A | Sample B |
| --- | --- | --- | --- |
| Ar pressure (Torr) |  | $8 \times 10^{-3}$ | $5 \times 10^{-3}$ |
| FE | RF power (W) | 300 | 600 |
|  | Forming rate (nm/sec.) | 0.021 | 0.045 |
| Cr | RF power (W) | 150 | 300 |
|  | Forming rate (nm/sec.) | 0.062 | 0.13 |

Figure 12A:
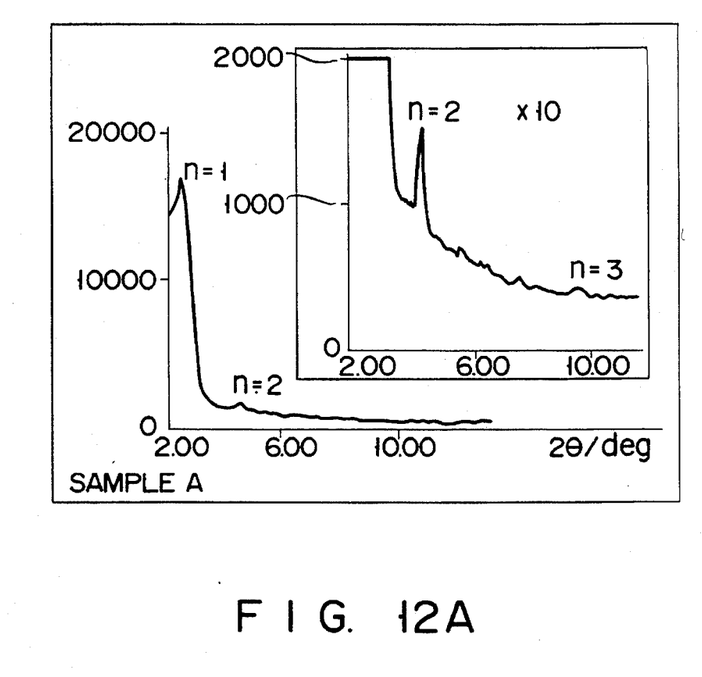
FIG. 12A is the X-ray diffraction chart of the artificial multilayer of Sample A.
Figure 12B:
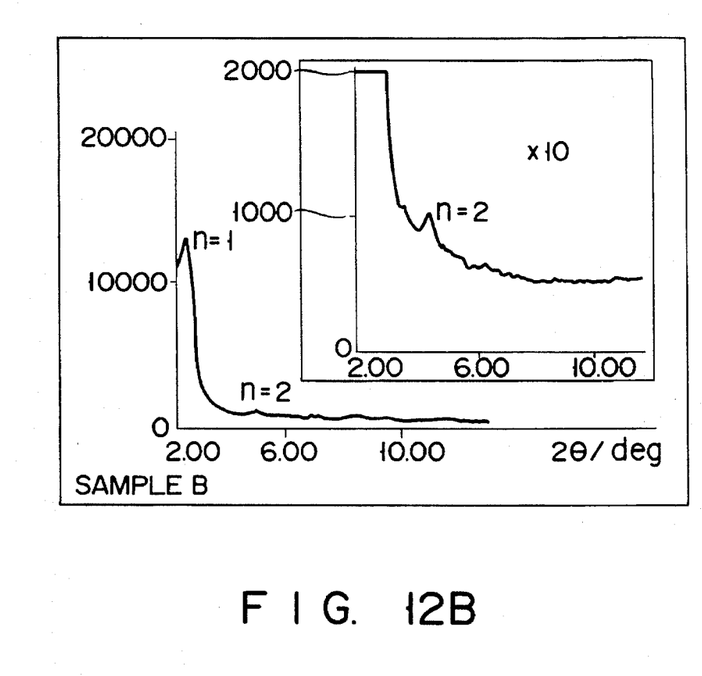
FIG. 12B is the X-ray diffraction chart of the artificial multilayer of Sample B, in Example 9.

An X-ray diffraction patterns of the artificial multilayers manufactured as described above are shown in FIGS. 12A and 12B. With regard to Sample A, tertiary peaks are observed which reflects the periodicity of the artificial multilayer. On the other hand, with regard to Sample B, only secondary peaks are observed. From these results, it is understood that the boundary between the Fe layer and the Cr layer is relatively sharp in Sample A, in other word, mixing of Fe atoms and Cr atoms was slight in the boundary. On the other hand, since the tertiary peaks are not observed in Sample B, it is understood that mixing of Fe and Cr atoms occurred in the boundary of the Fe layer and Cr layer.

Figure 13A:
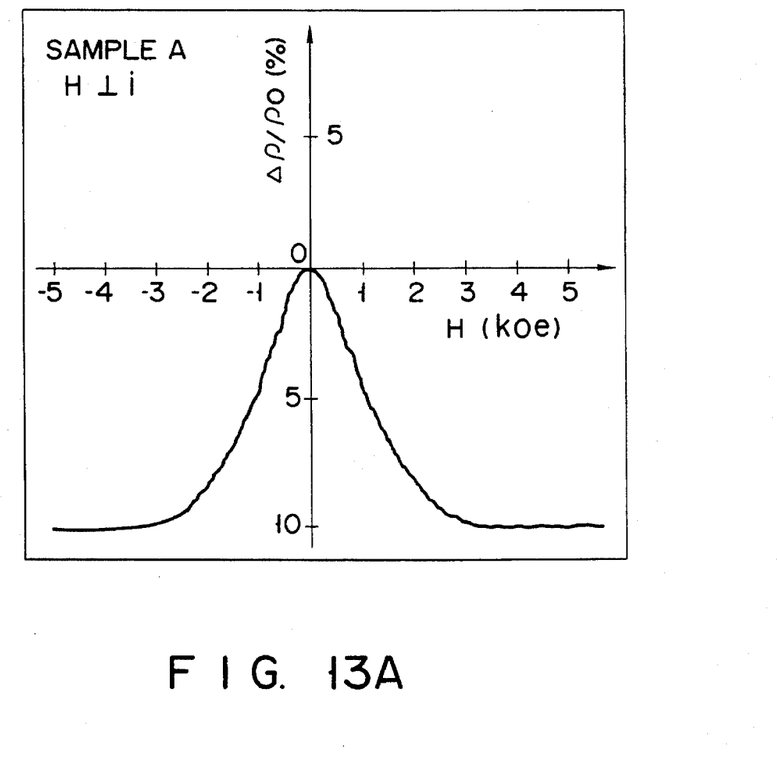
FIG. 13A shows the magnetoresistance effect when the direction of the magnetic field is crossed perpendicularly to that of the current.
Figure 13B:
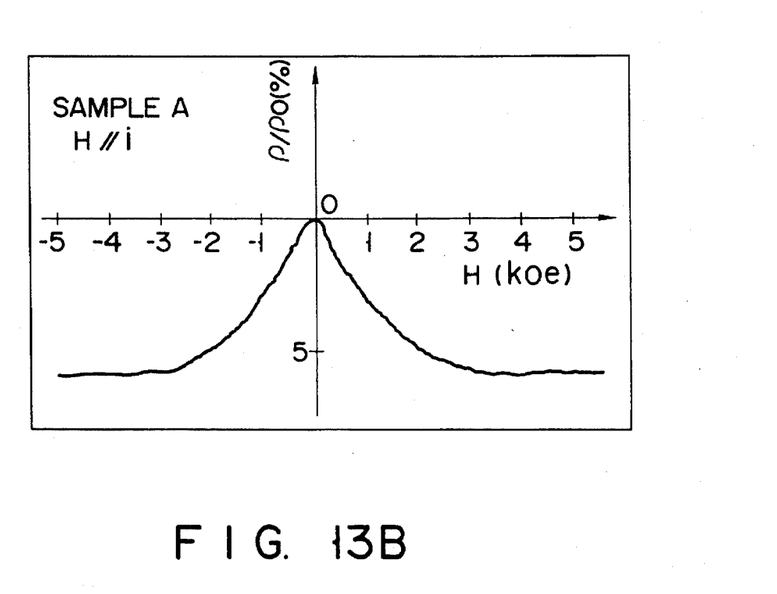
FIG. 13B shows the magnetoresistance effect when the direction of the magnetic field is parallel to that of the current, with regard to the sample A of the example 9.

FIGS. 13A and 13B show the magnetoresistance effects of the artificial multilayer of Sample A when the direction of the magnetic field was crossed perpendicularly to that of the current and the directions of both were parallel. As apparent from FIGS. 13A and 13B, the relative change of resistivity when the direction of the magnetic field was crossed perpendicularly to that of the current (FIG. 13A), is larger than that when the directions of the magnetic field and the current were parallel (FIG. 13B). In FIG. 13A, when the magnetic field of 3 kOe was applied, 10% of relative change of resistivity was observed.

In the case of Sample B, though not shown, the symbols of relative change of resistivity were different (plus or minus) according to the directions of the magnetic field and the current being either perpendicular or parallel. The magnitude of the relative change of resistivity was very small to 0.5% or less. These results exhibit a similar magnetoresistance effect generally observed in the ferromagnetic material such as Ni, in which the effect as the artificial multilayer is not present.

From the above-described results, it is understood that, since the metal atoms reaching the substrate have excessively high energy under the general layer forming conditions according to the RF magnetron sputtering apparatus (for example, Ar pressure: $3$–$5 \times 10^{-3}$ Torr, forming rate: 0.1 nm/sec. or more), atoms on the substrate are feasibly mobile, and mixing of the atoms in the laminated layers occurs, therefore the artificial multilayer having a sharp boundary is not obtained.

On the contrary, when the RF power is lowered in a range capable of sputtering as the condition for Sample A, the artificial multilayer having a sharp boundary is readily obtained. More specifically, it is preferable to set the RF power for the formation of the layers to 400 W or less in the case of Fe and 200 W or less in the case of Cr. However, when the RF power is extremely reduced, stable forming rate cannot be obtained. Therefore, it is preferable to set the RF power to 200 W or more for Fe layers and to 50 W or more for Cr layers. It is also effective to reduce the energy of the metal atoms reaching the substrate by setting the Ar pressure to $7 \times 10^{-7}$ Torr or more by the same reason described above.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A magnetoresistance device comprising:

ferromagnetic and non-magnetic layers which are laminated to form a multilayer structure, wherein said ferromagnetic layers have a uniaxial magnetic anisotropy along the surface of the said multilayer structure which is introduced by a magnetic field, each of said ferromagnetic layers having a thickness between 0.5 and 20 nm;

a substrate having a non-singlecrystalline surface, wherein said ferromagnetic and non-magnetic layers are laminated upon said substrate; and means, coupled to said multilayer structure, for measuring resistivity of the multilayer structure along a direction that is parallel to the layers of the multilayer structure.

2. The device according to claim 1, wherein said ferromagnetic layers consist of at least one selected from a group consisting of Fe, Co, Ni, and their alloys and compounds, and said nonmagnetic layers consist of at least one selected from a group consisting of V, Cr, Cu, Au, and their alloys and compounds.

3. The device according to claim 1, wherein said ferromagnetic layers consist of a single material.

4. The device according to claim 1, wherein said ferromagnetic layers consist of different materials.

5. The artificial multilayer according to claim 4, wherein said materials forming the ferromagnetic layers differ from each other in the magnitude of the magnetic anisotropy.

6. The device according to claim 1, wherein the thickness of each of said nonmagnetic layers ranges between 0.5 to 20 nm, and the entire thickness of the laminated layers ranges between 30 to 500 nm.

7. The device according to claim 1, wherein the direction of the uniaxial magnetic anisotropy in a first ferromagnetic layer differs from that in a second ferromagnetic layer adjacent to said first ferromagnetic layer.

8. The device according to claim 7, wherein the directions of the uniaxial magnetic anisotropies of the two adjacent ferromagnetic layers form an angle of 30° to 90°.

9. The device according to claim 1, wherein said substrate is a glass substrate.

10. A magnetoresistance device according to claim 1, wherein:

said means for measuring resistivity comprises a source of electrical current and a voltage meter.

11. A device according to claim 1, wherein said ferromagnetic layers are non-singlecrystalline layers.

12. A device according to claim 1, wherein said substrate is non-singlecrystalline.

13. A magnetoresistance device comprising:

ferromagnetic and non-magnetic layers which are alternately laminated to form a multilayer structure, wherein said ferromagnetic layers have a uniaxial magnetic anisotropy along the surface of said multilayer structure which is introduced by a magnetic field, each of said ferromagnetic layers having a thickness between 0.5 and 20 nm;

a substrate having a non-singlecrystalline wherein said ferromagnetic and non-magnetic layers are laminated upon said substrate; and means, coupled to said multilayer structure, for measuring resistivity of said multilayer structure along a direction that is parallel to the layers of the multilayer structure.

14. A magnetoresistance device according to claim 13, wherein:

said means for measuring resistivity comprises a source of electrical current and a voltage meter.

15. A device according to claim 13, wherein said ferromagnetic layers are non-singlecrystalline layers.

16. A device according to claim 13, wherein said substrate is non-singlecrystalline.

17. A magnetoresistance device, comprising:

a multilayer structure having a major surface, said multilayer structure formed from a lamination of ferromagnetic and non-magnetic layers upon a substrate having a non-singlecrystalline surface, wherein said ferromagnetic layers have uniaxial magnetic anisotropy in a direction that is parallel to the major surface of the multilayer structure Which is introduced by a magnetic field; and means, coupled to said multilayer structure, for measuring resistivity of the multilayer structure.

18. A device according to claim 15, wherein said ferromagnetic layers are non-singlecrystalline layers.

19. A device according to claim 17, wherein said substrate is non-singlecrystalline.

20. A magnetoresistance device, comprising:

a multilayer structure having a major surface, said multilayer structure formed from ferromagnetic and non-magnetic layers that are alternately laminated upon a substrate having a non-singlecrystalline surface, wherein said ferromagnetic layers have a uniaxial magnetic anisotropy that is parallel to the major surface of the multilayer structure which is introduced by a magnetic field; and means, coupled to said multilayer structure, for measuring resistivity of the multilayer structure.

21. A device according to claim 20, wherein said ferromagnetic layers are non-singlecrystalline layers.

22. A device according to claim 20, wherein said substrate is non-singlecrystalline.

23. A magnetoresistance device for measuring a change in resistivity due to the presence of a magnetic field where the device is located, comprising:

a substrate having a non-singlecrystalline surface;

a multilayer structure formed from a lamination of ferromagnetic and non-magnetic layers upon said substrate, said lamination having a major surface; and wherein said ferromagnetic layers have a uniaxial magnetic anisotropy that is parallel to the major surface of the lamination which is introduced by a magnetic field.

24. A device according to claim 23, further comprising:

a means for measuring a change in resistivity that functions in the presence of a magnetic field of between zero and 1500 Oersted., of up to about ten percent of the resistivity of the multilayer structure.

25. A device according to claim 23, wherein said ferromagnetic layers are non-singlecrystalline layers.

26. A device according to claim 23, wherein said substrate is non-singlecrystalline.

27. A magnetoresistance device for measuring a change in resistivity due to the presence of a magnetic field where the device is located, comprising:

a substrate having a non-singlecrystalline surface;

a multilayer structure formed from ferromagnetic and non-magnetic layers which are alternately laminated upon said substrate to form a lamination that has a major surface; and wherein said ferromagnetic layers have a uniaxial magnetic anisotropy that is parallel to the major surface of the lamination which is introduced by a magnetic field.

28. A device according to claim 27, further comprising:

a means for measuring a change in resistivity that functions in the presence of a magnetic field of between zero and 500 Oersted., of up to about ten percent of the resistivity of the multilayer structure.

29. A device according to claim 27, wherein said ferromagnetic layers are non-singlecrystalline layers.

30. A method of manufacturing a magnetoresistance device comprising ferromagnetic and non-magnetic layers on a substrate, having a non-singlecrystalline surface said ferromagnetic and non-magnetic layers being alternately laminated one upon the other, said method comprising the steps of:

depositing said ferromagnetic layers and non-magnetic layers upon said substrate, each of said ferromagnetic layers having a thickness between 0.5 and 20 nm; and introducing a uniaxial magnetic anisotropy into said ferromagnetic layers by applying a magnetic filed along the surface of said ferromagnetic layers.

31. The method according to claim 30, wherein a magnetic field is applied along the surface of said ferromagnetic layers during the formation thereof.

32. The method according to claim 30, wherein a magnetic field is applied along the surface of said ferromagnetic layer while heat treating after the formation of said multilayer.

33. The method according to claim 30, wherein said ferromagnetic layers consist of at least one selected from a group consisting of Fe, Co, Ni, and their alloys and compounds, and said nonmagnetic layers consist of at least one selected from a group consisting of V, Cr, Cu, Au, and their alloys and compounds.

34. The method according to claim 30, wherein said ferromagnetic layers consist of a single material.

35. The method according to claim 30, wherein said ferromagnetic layers consist of different materials.

36. The method according to claim 35, wherein said ferromagnetic layers differ from each other in the magnitude Of the magnetic anisotropy.

37. The method according to claim 30, wherein the thickness of each of said nonmagnetic layers ranges between 0.5 to 20 nm, and the entire thickness of the laminated layers ranges between 30 to 500 nm.

38. The method according to claim 30, wherein the direction of the uniaxial magnetic anisotropy in a first ferromagnetic layer differs from that in a second ferromagnetic layer adjacent to said first ferromagnetic layer.

39. The method according to claim 38, wherein the directions of the uniaxial magnetic anisotropies of the two adjacent ferromagnetic layers form an angle of 30° to 90°.

40. The method according to claim 30, wherein said non-singlecrystalline substrate is a glass substrate.

41. A method according to claim 30, wherein the means for measuring resistivity comprises a source of electrical current and a voltage meter.

42. A method according to claim 30, wherein said ferromagnetic layers are non-singlecrystalline layers.

43. A method according to claim 30, wherein said substrate is non-singlecrystalline.

44. A method of manufacturing a magnetoresistance device comprising ferromagnetic and non-magnetic layers, said ferromagnetic and non-magnetic layers being alternately laminated one upon the other to form a lamination having a major surface, said method comprising the steps of:

depositing said ferromagnetic and non-magnetic layers on a substrate having a non-singlecrystalline surface;

introducing uniaxial magnetic anisotropy into said ferromagnetic layers by applying a magnetic field that is parallel to the major surface of the lamination; and connecting a means for measuring resistivity to at least one of the non-magnetic layers.

45. A method according to claim 44, wherein said ferromagnetic layers are non-singlecrystalline layers.

46. A method according to claim 44, wherein said substrate is non-singlecrystalline.

47. A method of measuring a magnetic field with a magnetoresistance device, comprising the steps of:

forming a magnetoresistance device comprising a multilayer structure comprising a substrate having a non-single crystalline surface and a lamination of ferromagnetic and non-magnetic layers on said substrate, said lamination having a major surface, and said ferromagnetic layers having uniaxial magnetic anisotropy introduced by deposition in a magnetic field or annealing in a magnetic field along said major surface;

disposing the multilayer structure in a first magnetic field; and measuring a resistivity of the multilayer structure while the multilayer structure is in the first magnetic field.

48. A method according to claim 47, wherein the ferromagnetic and non-magnetic layers are alternately laminated.

49. A device according to claim 48, wherein said substrate is non-singlecrystalline.

50. A method according to claim 47, wherein the resistivity is measured along a direction that is parallel to the layers of the multilayer structure.

51. A method according to claim 47, wherein said ferromagnetic layers are non-singlecrystalline layers.

52. A method according to claim 47, wherein said substrate is non-singlecrystalline.

* * * * *